(12) United States Patent
Tomaszewicz

(10) Patent No.: US 10,153,745 B1
(45) Date of Patent: Dec. 11, 2018

(54) FEEDBACK COMPENSATED MASTER VOLUME CONTROL

(71) Applicant: John Gary Tomaszewicz, Coral Springs, FL (US)

(72) Inventor: John Gary Tomaszewicz, Coral Springs, FL (US)

(*) Notice: Subject to any disclaimer, the term of this patent is extended or adjusted under 35 U.S.C. 154(b) by 0 days.

(21) Appl. No.: 15/170,901

(22) Filed: Jun. 1, 2016

(51) Int. Cl.
  *H03G 7/00* (2006.01)
  *H03F 3/181* (2006.01)
  *H03F 3/22* (2006.01)

(52) U.S. Cl.
  CPC ............. *H03G 7/004* (2013.01); *H03F 3/181* (2013.01); *H03F 3/22* (2013.01); *H03F 2200/541* (2013.01)

(58) Field of Classification Search
  CPC ........... H03G 7/004; H03F 3/181; H03F 3/22; H03F 2200/541
  See application file for complete search history.

(56) References Cited

U.S. PATENT DOCUMENTS

| | | | | |
|---|---|---|---|---|
| 5,675,656 | A * | 10/1997 | Sondermeyer | G10H 1/16 381/100 |
| 9,184,714 | B2 * | 11/2015 | Scott | H03G 3/06 |
| 2012/0152089 | A1 * | 6/2012 | Smith | H03F 3/28 84/733 |
| 2013/0028447 | A1 * | 1/2013 | Scott | H03G 3/06 381/109 |

* cited by examiner

*Primary Examiner* — Sonia L Gay

(57) ABSTRACT

A circuit and a method for maintaining the desired tone, harmonic relationship and dynamic response of a musical instrument amplifier throughout the complete master volume power attenuation range.

8 Claims, 4 Drawing Sheets

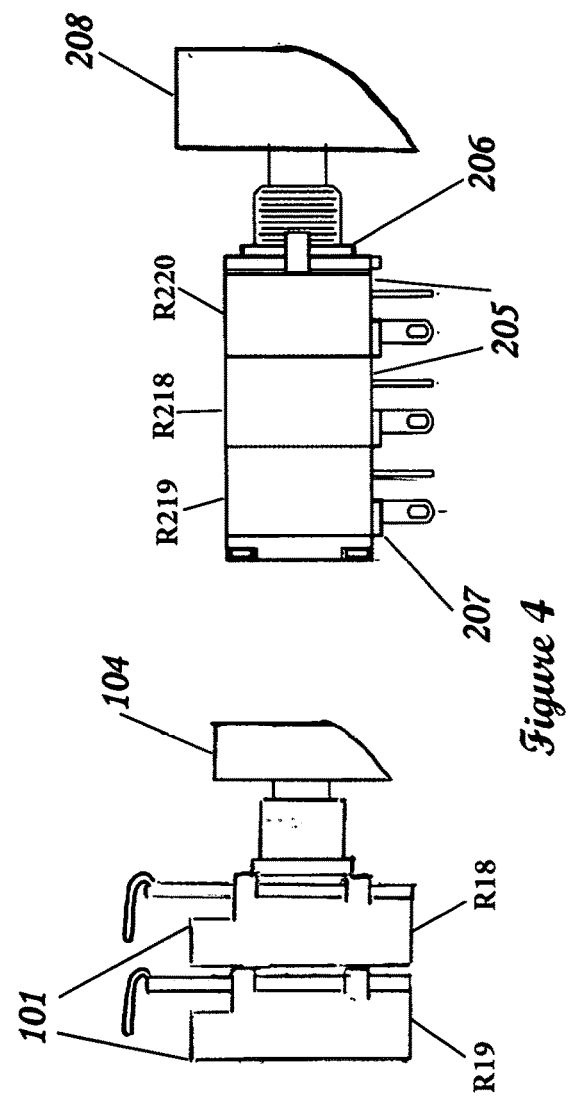

FEEDBACK COMPENSATED MASTER VOLUME CONTROL

BACKGROUND OF THE INVENTION

1. Field of the Invention

The present invention relates generally to the field of amplifier systems. More specifically the present invention relates to a feedback compensated master volume system which may utilize a dual-ganged potentiometer consisting of variable resistors to control audio signal levels as well as to control the feedback signal level, in a synchronized manner with a resistor in parallel variable resistor, with a value specifically chosen to limit the maximum feedback resistance and to govern the performance throughout the rotational operating range of the potentiometer. The present feedback compensated master volume system may be incorporated into the design of a tube guitar amplifier. Various embodiments may include a post phase-inverter cross-line master volume tube circuit. One embodiment of the present feedback compensated master volume system includes a single element of the dual potentiometer, a variable resistor, that may reduce the audio signal levels as a simple post phase-inverter cross-line master volume. The other element may be inserted as a variable resistor in parallel with the feedback resistor feeding the phase inverter feedback input portion of the circuit. Rotating the knob may decrease the feedback resistance thus causing an increase in the feedback voltage counteracting and correcting for the reduction in Power amp output voltage caused by the cross-line master.

2. Description of the Prior Art

There have long been volume amplifiers for musical instruments. Yet musical instrument amplifiers, while offering a desired sound rich in harmonics and a pleasing dynamic response, have long suffered from the requirement to operate them at excessive volume levels to obtain the guitarists desired performance characteristics. In the early years of Rock and Roll, this was not necessarily a problem for big name acts performing at large venues, since loud and powerful amps enabled the artists to connect with their large audiences. As public address systems grew larger and larger over the years, the volume levels required to reach the vast in audience were easily handled by the powerful public address system and gave control to the sound technician mixing and controlling the onstage instrument sounds. This necessitated the need for much lower stage volume levels. This need coupled with a new generation of musicians playing in much smaller club venues and home studios where lower volumes are demanded. The prior art is filled with numerous attempts at achieving an amplifier design that is capable of providing a variable output power level while maintaining the highly desired sonic characteristic of a vacuum tube based power amplifier driven into overdrive, thus yielding rich creamy harmonics along with a pleasing tactile touch sensitive dynamic transient response at volume levels suitable for a stadium or a living room.

Prior Art FIG. 1 shows the audio circuitry of a traditional guitar amplifier with a Master Volume Control. The signal from the guitar preamplifier is presented at VIN and coupled via capacitor C4 to the grid 2 of vacuum tube V3A which is the first of a long-tail vacuum tube pair V3A-V3B comprising the phase splitter/driver amplifiers. The resistors R8, R9, R6 and R7 comprise the biasing network of the pair V3A-V3B in a typical arrangement that provides signal coupling from a cathode 3 to a cathode 8 to provide amplified opposing phase signals developed across the resistors R4 and R5 from the plates 1 and 6, respectively. A negative feedback node F is created at the junction of R14, R7 and C3, enabling the output signal from transformer TR1 at the SPKR+ terminal to be injected back into the phase inverter as a negative feedback signal via R10. Capacitor C3 provides a zero signal reference point for the input grid 7 of V3B. A pair of coupling capacitors C1 and C2 deliver AC signals to the grids 5 and 13 of the push-pull output tubes V1 and V2, which are cathode biased via a resistor R1 and a bypass capacitor C6. The screen grids 4 and 12 are fed through the resistors R11 and R12 from a power supply point B. The power supply point A furnishes high-voltage to the plates of V1 and V2 through primary windings P1, and P2 of the output transformer. C indicates another high-voltage point of the power supply which is not shown in this simplified drawing. The secondary winding 17 drives the loudspeaker at terminals SPKR− and SPKR+.

The resistors R16 and R17 provide grid leak for the grids 5 and 13 respectively. A variable resistor R18 comprise the Master Volume control, which functions by gradually canceling out the audio signal at the grids 5 and 14 of the output tubes V1 and V2 as the Master Volume Control R18 is rotated counterclockwise thereby reducing the resistance value of R18.

In U.S. Pat. No. 6,140,870, a tube amp feeds solid-state power output section to achieve the desired sound. In U.S. Pat. No. 4,937,874, signal conditioning is used to create a compensated output for further amplification. In U.S. Pat. No. 5,268,527, a solid-state amp with tube amp impedance matching is utilized. In U.S. Pat. No. 5,550,509, the output section screen voltage is reduced to control the overall volume levels. In U.S. Pat. No. 5,727,069, a solid-state amp with tube limiting is utilized. In U.S. Pat. No. 6,111,961, a dummy load is utilized to reduce the signal levels. In U.S. Pat. No. 5,635,872, an adjustable power supply sag and distortion approach is utilized. In U.S. Pat. No. 8,155,348 B2, an external phase inverter anode voltage regulation apparatus is utilized.

The earlier attempts while approaching the desired effect, suffer added complex circuitry, reduced reliability, excessive additional cost, and most significantly, falling short of the desired sound quality that is an absolute necessity for the musician.

All of the prior attempts provide a reduction in sound quality as the sound output level is reduced.

It is thus an object of the present invention to provide a volume amplifier system such as for musical instruments which can provide variable output power levels including lower stage volume levels suitable for small club venues and home studios, while maintaining very is high sound quality.

It is another object of the present invention to provide such an amplifier system which nevertheless has relatively simple circuitry.

It is still another object of the present invention to provide such an amplifier system which is reliable and durable.

It is finally an object of the present invention to provide such an amplifier system which is relatively inexpensive to manufacture.

SUMMARY OF THE INVENTION

The present invention accomplishes the above-stated objectives, as well as others, as may be determined by a fair reading and interpretation of the entire specification.

One aspect of the invention is an apparatus for amplification comprising a dual-ganged potentiometer and a control device for the dual-ganged potentiometer. The dual-ganged potentiometer further comprises an audio signal level device and a variable resistor device. Activating the control device decreases resistance, reduces the cross-line resistance and feedback resistance simultaneously. The control device may be a single input device.

In one embodiment, the apparatus maintains sound quality/distortion throughout the volume (power attenuation) range. In an alternate embodiment, a triple ganged-potentiometer is located within the power amplifier.

BRIEF DESCRIPTION OF THE DRAWINGS

The accompanying drawings, which are included to provide a further understanding of the invention and are incorporated in and constitute a part of this specification, illustrate preferred embodiments of the invention and, together with the detailed description, serve to explain the principles of the invention. Various other objects, advantages, and features of the invention will become apparent to those skilled in the art from the following discussion taken in conjunction with the following drawings, in which:

Prior Art

FIG. 4 is an illustration of the dual and triple ganged potentiometers including their respective control knobs.

DETAILED DESCRIPTION OF THE PREFERRED EMBODIMENTS

Figure 1:
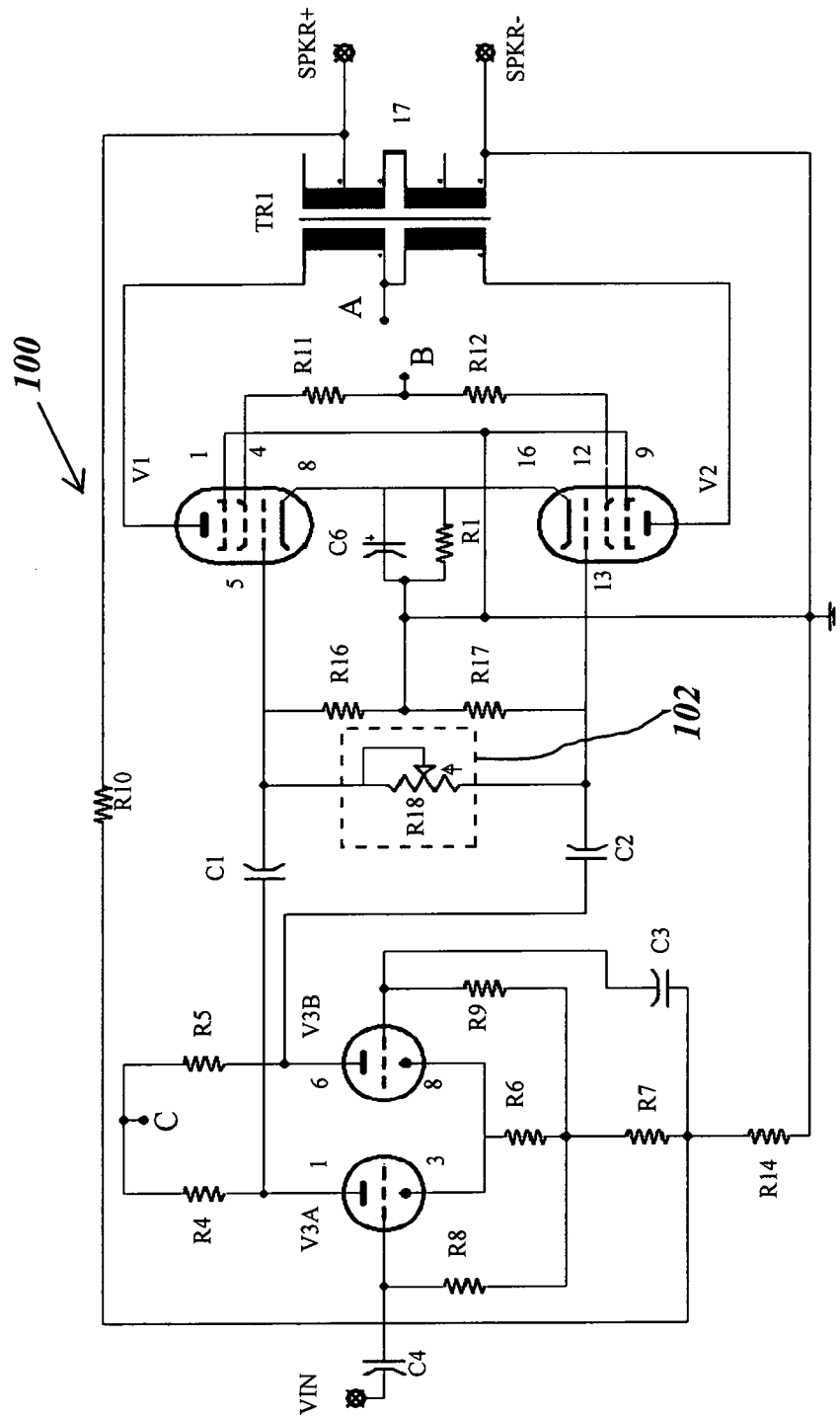
FIG. 1 is a schematic diagram of an exemplary prior amplifier.

As required, detailed embodiments of the present invention are disclosed herein; however, it is to be understood that the disclosed embodiments are merely exemplary of the invention which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Reference is now made to the drawings, wherein like characteristics and features of the present invention shown in the various FIGURES are designated by the same reference numerals.

First Preferred Embodiment

Figure 2:
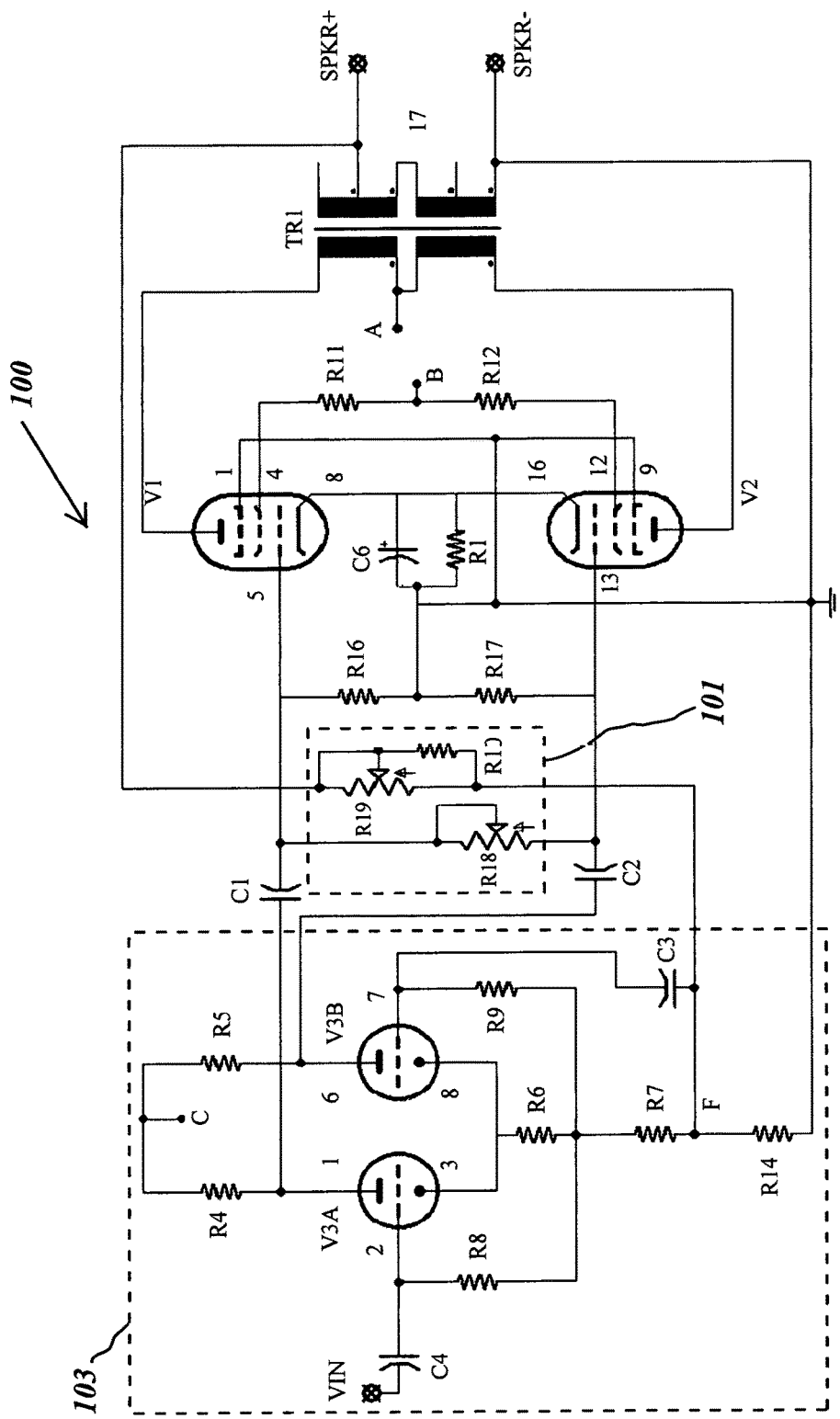
FIG. 2 is a schematic diagram of a first embodiment of the present invention.
Figure 3:
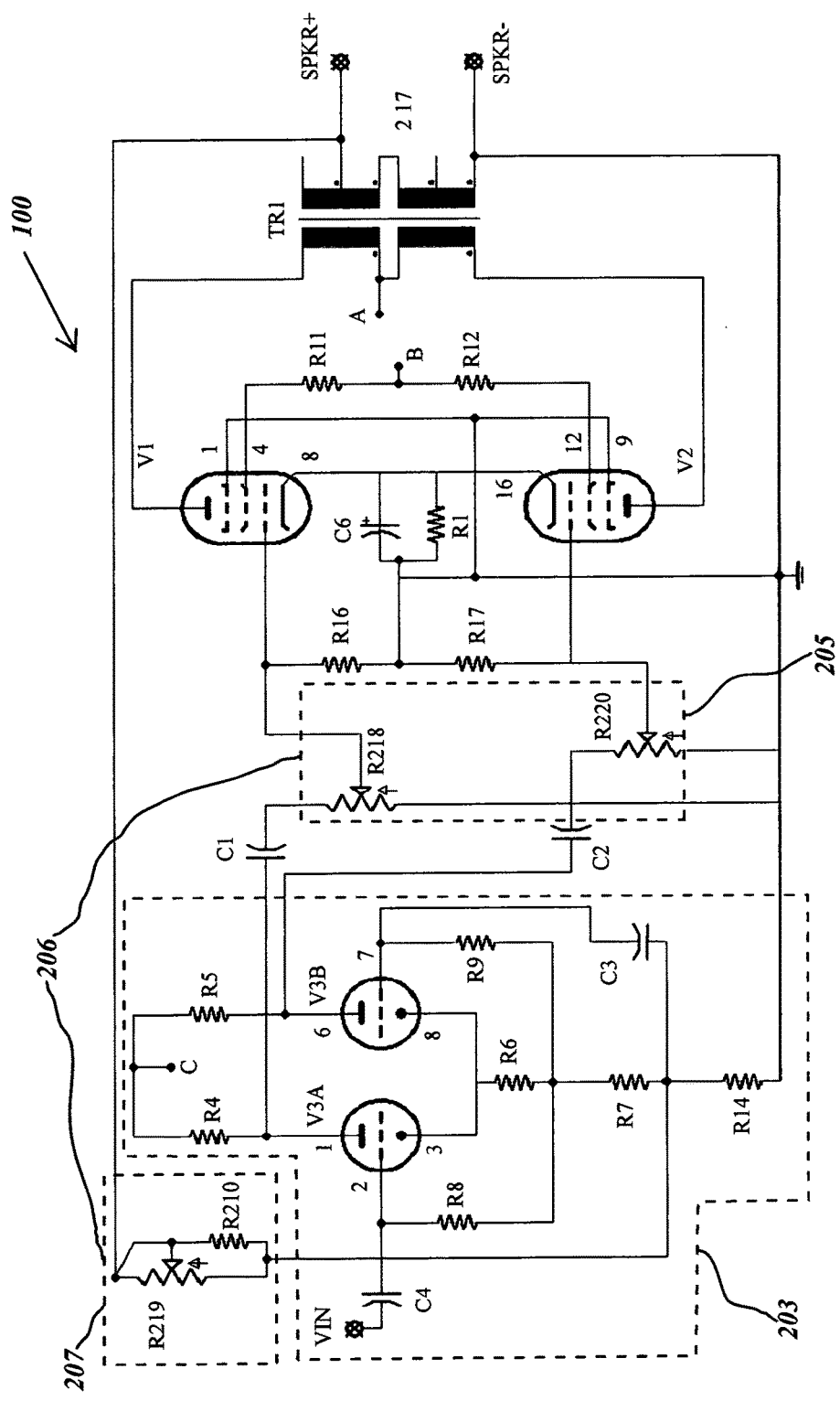
FIG. 3 is a schematic diagram of a second embodiment of the present invention.

Referring to FIGS. 2-3, a feedback compensated master volume control system 100 is disclosed.

Embodiments of the present invention may distribute the work of reducing volume among various functions within the circuitry of the power amplifier while simplifying the user interface to a single control knob. The sonic quality and output power level linkage of the present Embodiments of the present invention, described herein as the present feedback compensated master volume system 100, may effectively be broken, enabling the musician to control each independent of the other.

FIG. 1, as noted above, is provided as an example of traditional, prior circuitry that may provide the basis of the examples shown in FIGS. 2, and 3. FIGS. 2, and 3 each show examples of embodiments of the present invention. FIGS. 2, and 3 may be used in conjunction with the amplifier circuitry shown in FIG. 1, or with other push-pull amplifier circuitry which may include various phase splitter/phase inverter design configurations.

FIG. 2 shows the present feedback compensated master volume system 100 may utilize a dual-ganged potentiometer 101 consisting of variable resistors R18 to control audio signal levels as well as R19 to control the feedback signal level, in a synchronized manner with a resistor R10 in parallel variable resistor R19, with a value specifically chosen to limit the maximum feedback resistance and to govern the performance throughout the rotational operating range of the potentiometer. FIG. 2 shows how the present feedback compensated master volume system 100 may be incorporated into the design of a tube guitar amplifier. Various embodiments may include a post phase-inverter cross-line master volume tube circuit 102 as shown in FIG. 1.

FIG. 2 shows one embodiment of the present feedback compensated master volume system 100 that includes a single element of the dual potentiometer 101, variable resistor R18, that may reduce the audio signal levels as a simple post phase-inverter cross-line master volume. The other element of 101 may be inserted as a variable resistor R19 in parallel with the feedback resistor R10 acting as a feedback voltage control feeding the phase inverter feedback input portion F of the circuit 103. Rotating the knob 104 shown in FIG. 4 may decrease the feedback resistance thus causing an increase in the feedback voltage counteracting and correcting for the reduction in Power amp output voltage cause by the cross-line master R18.

FIG. 3 shows an alternate embodiment of the present feedback compensated master volume system 100 that includes a dual element 205 of the triple ganged potentiometer 206, variable resistors R218, and R220 that may reduce the audio signal levels as a simple post phase-inverter dual master volume. The other element 207 may be inserted as a variable resistor R219 in parallel with the feedback resistor R210 acting as a feedback voltage control feeding the phase inverter feedback input portion 2F of the circuit 203. Rotating the knob 208 shown in FIG. 4 may decrease the feedback resistor R210 thus causing an increase in the feedback voltage at node 2F counteracting the reduction in power amp output voltage cause by the dual element 205 of the triple ganged potentiometer 206.

In extreme settings, the circuit of the first embodiment shown in FIG. 2 may be capable of reducing the signal to "zero" sound. The useful range may be limited as the available power amp 100 output voltage approaches the required feedback voltage needed to maintain the desired sonic and dynamic performance.

Both elements of the dual ganged potentiometer 101 and feedback resistor R10 values were chosen by plotting the necessary voltage divider values to produce the required attenuation levels. When rotating the present feedback compensated master volume system 100 control 104 fully counter-clockwise, there may be no audio signal output. When rotating it fully clockwise, there may be full audio output as the control 104 may approach being electronically removed from the associated circuitry. Starting in the full clockwise position and rotating the knob 104 counter-clockwise, the power output level shall begin to drop. Throughout the counter-clockwise range of this control 104, the audio level reduction may be perceived as yielding no apparent change in sound quality or dynamic response. This may be due to the fact that synchronized events are occurring; one part audio signal reduction, and one part feedback voltage increase. As audio signals are reduced, they may slowly lose the ability to overdrive the power tube and transformer section 17 of the power amp 100. But, at the same time, the phase inverter 103 is being driven as it normally would as in full power output operation. The resultant effect may be for the amplifier 100 to approximate its desired sound characteristics independent of operational power output level.

Embodiments of the present invention may have control that provides the following functionality:

(A) 300 degree rotation of the knob 104 (fully clockwise) is the "zero point" and produces no perceivable reduction in sound level.

(B) From "zero point" counter-clockwise knob 104 rotation gradually decreases the signal all the way to 0% power output level.

In extreme settings, the circuit of the second embodiment shown in FIG. 3 may be capable of reducing the signal to "zero" sound. The useful range may be limited as the available power amp 100 output voltage approaches the required feedback voltage needed to maintain the desired sonic and dynamic performance.

All three elements of the triple ganged potentiometer 206 and feedback resistor R210 values were chosen by plotting the necessary voltage divider values to produce the required attenuation levels. When rotating the present feedback compensated master volume system 100 control 208 fully counter-clockwise, there may be no audio signal output. When rotating it fully clockwise, there may be full audio output as the control 208 may approach being electronically removed from the associated circuitry. Starting in the full clockwise position and rotating the knob 208 counter-clockwise, the power output level shall begin to drop. Throughout the counter-clockwise range of this control 208, the audio level reduction may be perceived as yielding no apparent change in sound quality or dynamic response. This may be due to the fact that synchronized events are occurring; one part audio signal reduction, and one part feedback voltage increase. As audio signals are reduced, they may slowly lose the ability to overdrive the power tube and transformer section 17 of the power amp 100. But, at the same time, the phase inverter 203 is being driven as it normally would as in full power output operation. The resultant effect may be for the amplifier 100 to approximate its desired sound characteristics independent of operational power output level.

Embodiments of the present invention may have control that provides the following functionality:

(A) 300 degree rotation of the knob 208 (fully clockwise) is the "zero point" and produces no perceivable reduction in sound level.

(B) From "zero point" counter-clockwise knob 208 rotation gradually decreases the signal all the way to 0% power output level.

Significant reduction in sound level while maintaining the desired sonic characteristics are achieved with the feedback compensated master volume system 100.

In each of the embodiments a variable resistance element such as a variable attenuator or variable resistor is used. The variable resistance element may comprise a potentiometer or a potentiometer type variable resistor such as a rotary switch. In some embodiments the rotary switch implementation may offer greater flexibility in the choice of resistance values, and design parameters.

Synchronization

As the present feedback compensated master volume system control 104 is engaged and rotated counter-clockwise, the perceived audio loudness is reduced due to one part power amplifier audio signal attenuation and one part feedback voltage increase, thereby reducing the output power level as these linked circuit elements R18 and R19 work concurrently to provide a feedback compensated post phase inverter signal reduction.

Increasing the effectiveness of the present feedback compensated master volume system 100 may be possible by tuning the synchronization of the resistance values in this process.

Detailed descriptions of preferred embodiments in many forms of the present invention are illustrated and described herein, it is understood that the present disclosure is intended to be illustrative only and is not intended to limit the invention to the aforementioned specific embodiments. One of ordinary skill in the art may make changes to the embodiments described without departing from the scope of the invention.

While the invention has been described, disclosed, illustrated and shown in various terms or certain embodiments or modifications which it has assumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. An amplifier for musical instruments, comprising:
a ganged potentiometer comprising a control device which produces a controlled feedback resistance having a feedback resistance ratio and producing a phase inverter feedback voltage;
an audio signal level device and a variable resistor device;
a push-pull transformer coupled output amplifier having a plurality of electron emitting devices;
an apparatus to link master volume attenuation with a feedback resistance ratio consisting of a ganged potentiometer; such that a feedback voltage ratio is maintained relative to the power amplifier input signal independent of the power amplifier output attenuation
wherein activating the control device increases resistance, increases power amplifier output, reduces the phase inverter feedback voltage, and increases the feedback resistance.

2. The amplifier of claim 1, further comprising a manually-operated dial to control a first variable resistance element and a second variable resistance element, wherein the resistance of a first variable resistance element increases and the resistance of a second variable resistance element increases when the dial is turned clockwise; and the resistance of a first variable resistance element decreases and the resistance of a second variable resistance element decreases when the dial is tamed counterclockwise.

3. An amplifier for musical instruments comprising:
a ganged potentiometer;
wherein said ganged potentiometer comprises a control device, an audio signal level device and a variable resistor device; and wherein activating the control device increases resistance, increases power amplifier output, reduces the phase inverter feedback voltage, and increases the feedback resistance.

4. The amplifier of claim 3, further comprising:
a push-pull transformer coupled output amplifier having a plurality of electron emitting devices;
an apparatus to link master volume attenuation with a feedback ratio consisting of a triple ganged potentiometer, such that a feedback voltage ratio is maintained relative to the power amplifier input signal independent of the power amplifier output attenuation.

5. The amplifier of claim 3, wherein the control device is a single input device.

6. The amplifier of claim 3, further comprising a manually-operated dial to control a first variable resistance element, a second variable resistance element, and a third variable resistance element.

7. The amplifier of claim 5, wherein said ganged potentiometer comprises a first variable resistance element and a second variable resistance element and a third variable resistance element and an actuation shaft connecting said first variable resistance element, said second variable resistance element and said third variable resistance element further comprising an actuator shaft, wherein said first variable resistance element, said second variable resistance element, the said third variable resistance element are ganged to the actuator shaft.

8. The amplifier of claim 5, wherein said ganged potentiometer comprises a first variable resistance element and a second variable resistance element and a third variable resistance element and an actuation shaft connecting said first variable resistance element, said second variable resistance element and said third variable resistance element further comprising a dial, wherein: the resistance of said first variable resistance element increases, said second variable resistance element increases, and said third variable resistance element increases when the dial is turned clockwise; and the resistance of said first variable resistance element decreases, said second variable resistance element decreases, and said third variable resistance element decreases when the dial is turned counterclockwise.

* * * * *